(12) United States Patent
Moane et al.

(10) Patent No.: US 7,453,305 B2
(45) Date of Patent: Nov. 18, 2008

(54) VOLTAGE LEVEL SHIFTING CIRCUIT, A DIFFERENTIAL INPUT STAGE CIRCUIT, AND A METHOD FOR PROVIDING A LEVEL SHIFTED DIFFERENTIAL SIGNAL TO A DIFFERENTIAL INPUT BUFFER CIRCUIT

(75) Inventors: Brian Anthony Moane, Raheen (IE); Colm Patrick Ronan, Caherconlish (IE); John Twomey, Fountainstown (IE)

(73) Assignee: Analog Devices, Inc., Norwood, MA (US)

( * ) Notice: Subject to any disclaimer, the term of this patent is extended or adjusted under 35 U.S.C. 154(b) by 62 days.

(21) Appl. No.: 11/494,168

(22) Filed: Jul. 27, 2006

(65) Prior Publication Data

US 2008/0024222 A1    Jan. 31, 2008

(51) Int. Cl.
*H03L 5/00* (2006.01)
(52) U.S. Cl. .................... 327/307; 327/306
(58) Field of Classification Search ........... 327/306, 327/333, 362; 326/62–63
See application file for complete search history.

(56) References Cited

U.S. PATENT DOCUMENTS

| | | | |
|---|---|---|---|
| 4,393,347 A * | 7/1983 | Looper ................ 324/126 |
| 5,486,777 A | 1/1996 | Nguyen | |
| 5,488,306 A | 1/1996 | Bonaccio | |
| 5,867,775 A | 2/1999 | Shirai et al. | |
| 6,111,437 A | 8/2000 | Patel | |
| 6,147,515 A | 11/2000 | Ang et al. | |
| 6,493,401 B1 | 12/2002 | Erckert | |
| 6,590,436 B2 * | 7/2003 | Jordanger et al. ....... 327/333 |
| 6,696,890 B2 | 2/2004 | Hedberg et al. | |
| 6,915,459 B2 | 7/2005 | Tinsley et al. | |
| 6,985,021 B1 * | 1/2006 | Zaliznyak et al. ........ 327/333 |
| 7,102,390 B2 * | 9/2006 | Frans et al. ................ 326/82 |
| 7,162,375 B2 * | 1/2007 | Van Epps et al. ........... 702/57 |
| 2002/0144188 A1 | 10/2002 | Tinsley et al. | |
| 2005/0228306 A1 | 10/2005 | Kurtz | |

* cited by examiner

*Primary Examiner*—Dinh T. Le
(74) *Attorney, Agent, or Firm*—Wolf, Greenfield & Sacks P.C.

(57) ABSTRACT

A voltage level shifting circuit (5) for shifting the common mode voltage of a differential signal to be within the working range of a differential input buffer circuit (3) comprises a first resistive voltage divider circuit (18) coupled between a first input terminal (10) and a voltage reference terminal (15) for receiving a voltage reference to which the common mode voltage of the level shifted differential signal is to be referenced, and a second resistive voltage divider circuit (18) coupled between a second input terminal (11) and the voltage reference terminal (15). The differential signal is applied to the first and second terminals (10,11), and the level shifted differential signal is produced on first and second output taps (17,19) of the first and second resistive voltage divider circuits (16,18) with the common mode of the level shifted differential signal referenced to the voltage reference applied to the voltage reference terminal (15). First and second high frequency low impedance circuits (22,23) couple the first and second input terminals (10,11) to the first and second output taps (17,19) to provide respective direct current blocked high frequency low impedance paths for the differential signal to first and second differential inputs (7,8) of the differential input buffer circuit (3) for minimizing propagation delays resulting from low pass filters created by the interaction of the first and second resistive voltage divider circuits (16,18) with first and second intrinsic input capacitance ($C_{b1}$, $C_{b2}$) coupling the first and second differential inputs (7,8) of the differential input buffer circuit (3) to ground.

42 Claims, 8 Drawing Sheets

VOLTAGE LEVEL SHIFTING CIRCUIT, A DIFFERENTIAL INPUT STAGE CIRCUIT, AND A METHOD FOR PROVIDING A LEVEL SHIFTED DIFFERENTIAL SIGNAL TO A DIFFERENTIAL INPUT BUFFER CIRCUIT

FIELD OF THE INVENTION

The present invention relates to a voltage level shifting circuit for level shifting a differential signal with a common mode voltage of the level shifted differential signal referenced to a voltage reference, and for applying the level shifted differential signal to a differential input buffer circuit, and in particular, for level shifting a differential signal from a differential data bus with high swing common mode voltage levels, and for applying the level shifted differential signal to a differential input buffer circuit with propagation delays minimised, where the swing in the common mode voltage permitted on the differential data bus exceeds the power supply voltage of the differential input buffer circuit, and the differential input buffer circuit includes intrinsic input capacitance. The invention also relates to a differential input stage circuit comprising a differential input buffer circuit with intrinsic input capacitance, and the voltage level shifting circuit for level shifting a differential signal and for applying the level shifted differential signal to the differential input buffer circuit with the common mode voltage of the level shifted differential signal referenced to a voltage reference and with propagation delays minimised, where the swing in the common mode voltage permitted on the differential data bus exceeds the power supply voltage of the differential input buffer circuit, and the differential input buffer circuit includes intrinsic input capacitance. The invention also relates to a method for producing a level shifted differential signal from a differential signal with a common mode voltage of the level shifted differential signal referenced to a voltage reference and for applying the level shifted differential signal to a differential input buffer circuit with propagation delays minimised, where the swing in the common mode voltage permitted on the differential data bus exceeds the power supply voltage of the differential input buffer circuit, and the differential input buffer circuit includes intrinsic input capacitance

BACKGROUND TO THE INVENTION

Differential data buses are commonly used for relaying data between digital signal processing circuits, and the data is relayed in the form of a digital signal. Differential data buses are shared by many digital signal processing circuits which may operate at different common mode voltage levels, and thus standards are imposed which regulate the minimum and maximum common mode voltages which are permitted on the data bus. However, such standards permit common mode voltage levels within relatively wide voltage ranges. For example, the RS485 standard permits common mode voltage levels of differential signals to range from −7 volts to +12 volts. Digital signal processing circuits are provided with input stages for receiving a differential signal from a differential data bus, which condition the differential signal prior to it being applied to the digital signal processing circuit. Such input stages may operate with supply voltages, and in turn working voltage ranges as low as five volts and even lower. In order to protect such input stages and the digital signal processing circuits from differential signals the common mode voltage of which is outside the working voltage range of the input stage, voltage level shifting circuits are provided. Such voltage level shifting circuits receive the differential signal from the differential data bus, and shift the common mode voltage of the differential signal to a level within the working range of the input stage of the digital signal processing circuit, which is then applied to the input stage.

Typically, such voltage level shifting circuits comprise first and second input terminals for receiving respective first and second signals of a differential signal pair of a differential signal from the differential data bus. First and second resistive voltage divider circuits extend between a voltage reference terminal and the respective first and second input terminals, and define respective first and second output taps intermediate the voltage reference terminal and the first and second input terminals. First and second signals of a level shifted differential signal pair of the level shifted differential signal with the common mode voltage referenced to a voltage reference applied to the voltage reference terminal are produced on the first and second output taps. The level shifted differential signal on the first and second output taps is applied to respective first and second differential inputs of a differential input buffer circuit of the input stage for conditioning prior to being applied to the digital signal processing circuit.

However, such arrangements of voltage level shifting circuits and differential input buffer circuits result in propagation delays when the level shifted differential signal is applied to the differential input buffer circuit, where the differential input buffer circuit includes intrinsic input capacitance. This is particularly so in differential input buffer circuits which are implemented in BiCMOS processes. In general, in such BiCMOS differential input buffer circuits the first and second differential inputs thereof to which the level shifted differential signal is applied each have intrinsic input capacitance through which the differential inputs are capacitively coupled to ground. The propagation delays result from the interaction of the first and second resistive voltage divider circuits of the voltage level shifting circuit with the corresponding intrinsic input capacitance of the first and second differential inputs of the differential input buffer circuit. The interaction of the first and second resistive voltage divider circuits with the corresponding intrinsic input capacitance of the first and second differential inputs of the differential input buffer circuit creates respective low pass filters which cause the propagation delays.

In order to comply with minimum bus loading requirements of data bus standards, and to provide appropriate resistive ratios in the first and second resistive voltage divider circuits, in general, the resistance values of the first and second resistive voltage divider circuits are relatively high, and are of values such that the interaction of the first and second resistive voltage divider circuits with the respective first and second intrinsic input capacitance results in significant propagation delays in the level shifted signal applied to the first and second differential inputs of the differential input buffer circuit. The propagation delay of concern in the level shifted signal applied to the differential input buffer circuit is the time delay from the change in polarity of the differential signal applied to the first and second input terminals of the voltage level shifting circuit to the time a corresponding polarity change occurs in the level shifted differential signal applied to the first and second differential inputs of the differential input buffer circuit. In some cases, as will be discussed in detail below, the propagation delay in the level shifted differential signal resulting from the interaction of the first and second resistive voltage divider circuits with the respective first and second intrinsic input capacitance can be as high as 30 nanoseconds and even higher. While such propagation delays may be tolerated where differential signals are at data rates up to 5 Mbits per second, such propagation delays cannot be tolerated at higher data rates, and in particular, at data rates above 8 Mbits per second. At such data rates propagation delays can lead to corruption and loss of data.

There is therefore a need for a voltage level shifting circuit which addresses the problem of propagation delays. There is also a need for a differential input stage circuit for receiving differential signals from a high swing common mode voltage level differential data bus for applying to a digital signal processing circuit, which addresses the problem of propagation delays. Additionally, there is a need for a method for level shifting a differential signal from a high swing common mode voltage level differential data bus and for applying the level shifted differential signal to a differential input buffer circuit with intrinsic input capacitance which addresses the problem of propagation delays.

The present invention is directed towards providing such a voltage level shifting circuit, a differential input stage circuit and a method for level shifting a differential signal from a differential data bus with high swing common mode voltage levels for applying to a differential input buffer circuit with intrinsic input capacitance.

SUMMARY OF THE INVENTION

According to the invention there is provided a voltage level shifting circuit for level shifting a differential signal with a common mode voltage of the level shifted differential signal referenced to a voltage reference and for applying the level shifted differential signal to a differential input buffer circuit with propagation delays minimised, the differential input buffer circuit being of the type comprising first and second differential inputs for receiving the level shifted differential signal from the voltage level shifting circuit, the first and second differential inputs of the differential input buffer circuit having respective first and second intrinsic input capacitance, the voltage level shifting circuit comprising:

a first input terminal for receiving a first signal of a differential signal pair of the differential signal, a second input terminal for receiving a second signal of the differential signal pair of the differential signal, a first resistive voltage divider circuit coupled between the first input terminal and a voltage reference terminal for receiving the voltage reference, a second resistive voltage divider circuit coupled between the second input terminal and the voltage reference terminal, first and second output taps defined by the respective first and second resistive voltage divider circuits on which are produced respective first and second level shifted signals of a level shifted differential signal pair of the level shifted differential signal with the common mode voltage thereof referenced to the voltage reference for applying to the first and second differential inputs, respectively, of the differential input buffer circuit, a first high frequency low impedance circuit forming a direct current blocked high frequency low impedance path extending between the first input terminal and the first output tap for accommodating the first signal of the differential signal pair from the first input terminal to the first output tap with propagation delays minimised when the first level shifted signal of the level shifted differential signal pair is applied to the first differential input of the differential input buffer circuit, the first high frequency low impedance circuit and the first resistive voltage divider circuit co-operating with the first intrinsic input capacitance of the first differential input of the differential input buffer circuit to form a first low pass filter, and a second high frequency low impedance circuit forming a direct current blocked high frequency low impedance path extending between the second input terminal and the second output tap for accommodating the second signal of the differential signal pair from the second input terminal to the second output tap for minimising propagation delays when the second level shifted signal of the level shifted differential signal pair is applied to the second differential input of the differential input buffer circuit, the second high frequency low impedance circuit and the second resistive voltage divider circuit co-operating with the second intrinsic input capacitance of the second differential input of the differential input buffer circuit to form a second low pass filter, the first and second low pass filters acting to filter out noise in the differential signal at frequencies above the cut-off frequencies of the first and second low pass filters.

In one embodiment of the invention the first high frequency low impedance circuit the first high frequency low impedance circuit is coupled in parallel with at least a portion of the first resistive voltage divider circuit extending between the first input terminal and the first output tap.

In another embodiment of the invention the first high frequency low impedance circuit is coupled in parallel with the first resistive voltage divider circuit extending between the first input terminal and the first output tap.

Preferably, the first high frequency low impedance circuit comprises a first capacitive element, and advantageously, the first high frequency low impedance circuit comprises a first resistive element coupled in series with the first capacitive element.

In one embodiment of the invention the first resistive element is provided by a portion of the first resistive voltage divider circuit extending between the first input terminal and the first output tap.

In another embodiment of the invention the first resistive element is coupled between the first input terminal and the first capacitive element.

Preferably, the values of the first resistive element and the first capacitive element are selected so that the impedance offered by the first high frequency low impedance circuit to signals of frequency corresponding to the data rate of the differential signal is less than the impedance offered to signals of such frequency by the portion of the first resistive voltage divider circuit between the first input terminal and the first output tap.

In one embodiment of the invention the impedance of the first high frequency low impedance circuit is selected so that the attenuation resulting from a low pass filter created by the interaction of the first resistive voltage divider circuit with the first intrinsic input impedance of the differential input buffer circuit at frequencies corresponding to the data rate of the differential signal is reduced by at least 1 dB.

Preferably, the impedance of the first high frequency low impedance circuit is selected so that the attenuation resulting from a low pass filter created by the interaction of the first resistive voltage divider circuit with the first intrinsic input impedance of the differential input buffer circuit at frequencies corresponding to the data rate of the differential signal is reduced by at least 3 dBs.

In another embodiment of the invention the value of the first capacitive element is selected to be greater than a value produced by the product of the value of the first intrinsic input capacitance of the differential input buffer circuit by the division ratio of the first resistive voltage divider circuit.

In one embodiment of the invention the second high frequency low impedance circuit is coupled in parallel with at least a portion of the second resistive voltage divider circuit extending between the second input terminal and the second output tap.

In another embodiment of the invention the second high frequency low impedance circuit is coupled in parallel with the second resistive voltage divider circuit extending between the second input terminal and the second output tap.

Preferably, the second high frequency low impedance circuit comprises a second capacitive element, and advantageously the second high frequency low impedance circuit comprises a second resistive element coupled in series with the second capacitive element.

In one embodiment of the invention the second resistive element is provided by a portion of the second resistive voltage divider circuit extending between the second input terminal and the second output tap.

In another embodiment of the invention the second resistive element is coupled between the second input terminal and the second capacitive element.

In one embodiment of the invention the values of the second resistive element and the second capacitive element are selected so that the impedance offered by the second high frequency low impedance circuit to signals of frequency corresponding to the data rate of the differential signal is less than the impedance offered to signals of such frequency by the portion of the second resistive voltage divider circuit between the second input terminal and the second output tap.

In a further embodiment of the invention the impedance of the second high frequency low impedance circuit is selected so that the attenuation resulting from a low pass filter created by the interaction of the second resistive voltage divider circuit with the second intrinsic input impedance of the differential input buffer circuit at frequencies corresponding to the data rate of the differential signal is reduced by at least 1 dB.

Preferably, the impedance of the second high frequency low impedance circuit is selected so that the attenuation resulting from a low pass filter created by the interaction of the second resistive voltage divider circuit with the second intrinsic input impedance of the differential input buffer circuit at frequencies corresponding to the data rate of the differential signal is reduced by at least 3 dBs.

In one embodiment of the invention the value of the second capacitive element is selected to be greater than a value produced by the product of the value of the second intrinsic input capacitance of the differential input buffer circuit by the division ratio of the second resistive voltage divider circuit.

In a further embodiment of the invention the first and second high frequency low impedance circuits are adapted for accommodating first and second signals of a differential signal pair of a differential signal at a data rate of at least 5 Mbits per second.

Additionally the invention provides a differential input stage circuit comprising:

a differential input buffer circuit having first and second differential inputs with respective first and second intrinsic input capacitance, a voltage level shifting circuit for level shifting a differential signal with a common mode voltage of the level shifted differential signal referenced to a voltage reference and for applying the level shifted differential signal to the first and second differential inputs of the differential input buffer circuit with propagation delays minimised, the voltage level shifting circuit comprising:

a first input terminal for receiving a first signal of a differential signal pair of the differential signal, a second input terminal for receiving a second signal of the differential signal pair of the differential signal, a first resistive voltage divider circuit coupled between the first input terminal and a voltage reference terminal for receiving the voltage reference, a second resistive voltage divider circuit coupled between the second input terminal and the voltage reference terminal, first and second output taps defined by the respective first and second resistive voltage divider circuits on which are produced respective first and second level shifted signals of a level shifted differential signal pair of the level shifted differential signal with the common mode voltage thereof referenced to the voltage reference, the first and second output taps being coupled to the respective first and second differential inputs of the differential input buffer circuit for applying the level shifted differential signal to the differential input buffer circuit, a first high frequency low impedance circuit forming a direct current blocked high frequency low impedance path extending between the first input terminal and the first output tap for accommodating the first signal of the differential signal pair from the first input terminal to the first differential input of the differential input buffer circuit with propagation delays minimised, the first high frequency low impedance circuit and the first resistive voltage divider circuit co-operating with the first intrinsic input capacitance of the first differential input of the differential input buffer circuit to form a first low pass filter, and a second high frequency low impedance circuit forming a direct current blocked high frequency low impedance path extending between the second input terminal and the second output tap for accommodating the second signal of the differential signal pair from the second input terminal to the second differential input of the differential input buffer circuit with propagation delays minimised, the second high frequency low impedance circuit and the second resistive voltage divider circuit co-operating with the second intrinsic input capacitance of the second differential input of the differential input buffer circuit to form a second low pass filter, the first and second low pass filters acting to the differential signal at frequencies above the cut-off frequencies of the first and second low pass filters.

Further the invention provides a method for producing a level shifted differential signal from a differential signal with a common mode voltage of the level shifted differential signal referenced to a voltage reference and for applying the level shifted differential signal to a differential input buffer circuit with propagation delays minimised, the differential input buffer circuit being of the type comprising first and second differential inputs for receiving the level shifted differential signal, the first and second differential inputs of the differential input buffer circuit having respective first and second intrinsic input capacitance, the method comprising:

providing a voltage level shifting circuit comprising:

a first input terminal for receiving a first signal of a differential signal pair of the differential signal, a second input terminal for receiving a second signal of the differential signal pair of the differential signal, a first resistive voltage divider circuit coupled between the first input terminal and a voltage reference terminal, a second resistive voltage divider circuit coupled between the second input terminal and the voltage reference terminal, first and second output taps defined by the respective first and second resistive voltage divider circuits on which are produced respective first and second level shifted signals of a level shifted differential signal pair of the level shifted differential signal with the common mode voltage thereof referenced to the voltage reference for applying to the first and second differential inputs, respectively, of the differential input buffer circuit, the method further comprising:

providing a first high frequency low impedance circuit forming a direct current blocked high frequency low impedance path extending between the first input terminal and the first output tap for accommodating the first signal of the differential signal pair from the first input terminal to the first output tap with propagation delays minimised when the first level shifted signal of the level shifted differential signal pair is applied to the first differential input of the differential input buffer circuit, the first high frequency low impedance circuit and the first resistive voltage divider circuit co-operating with the first intrinsic input capacitance of the first differential input of the differential input buffer circuit to form a first low pass filter, providing a second high frequency low impedance circuit forming a direct current blocked high frequency low impedance path extending between the second input terminal and the second output tap for accommodating the second signal of the differential signal pair from the second input terminal to the second output tap for minimising propagation delays when the second level shifted signal of the level shifted differential signal pair is applied to the second differential input of the differential input buffer circuit, the second high frequency low impedance circuit and the second resistive voltage divider circuit co-operating with the second intrinsic input capacitance of the second differential input of the differential input buffer circuit to form a second low pass filter the first and second low pass filters acting to filter out noise in the differential signal at frequencies above the cut-off frequencies of the first and second low pass filters, applying the voltage reference to the voltage reference terminal, applying first and second signals of the differential signal pair of the differential signal to the respective first and second input terminals, and applying the level shifted first and second signals of the level shifted differential signal pair on the first and second output taps to the respective first and second differential inputs of the differential input buffer circuit.

ADVANTAGES OF THE INVENTION

The advantages of the invention are many. The invention provides a voltage level shifting circuit which produces a level shifted differential signal, the common mode voltage of which is referenced to a voltage reference, and which is thus within the working voltage range of a differential input buffer circuit, and in which the propagation delay from the change in the polarity of the differential signal applied to the first and second input terminals of the voltage level shifting circuit to the corresponding change in the polarity of the differential signal applied to the differential input buffer circuit is minimised. By reducing the propagation delay in the differential signal applied to the differential input buffer circuit, the voltage level shifting circuit according to the invention is particularly suitable for differential signals of relatively high data rate from a high swing common mode voltage level differential data bus. This is so even when the level shifted differential signal is applied to differential inputs of a differential input buffer circuit in which the differential inputs of the differential input buffer circuit have intrinsic input capacitance which interact with the first and second resistive voltage divider circuits tending to introduce such propagation delay. Additionally, the voltage level shifting circuit according to the invention interacts with the intrinsic input capacitance of the differential input buffer circuit to form low pass filters for filtering out noise in the differential signal at frequencies above the cut-off frequencies of the low pass filters.

Similar advantages are achieved from the differential input stage circuit according to the invention and from the method for producing a level shifted differential signal according to the invention.

The invention and its many advantages will be readily apparent from the following description of some preferred embodiments thereof which are given by way of example only with reference to the accompanying drawings and which are not to be considered as limiting the scope of the invention.

DETAILED DESCRIPTION OF THE INVENTION

Figure 1:
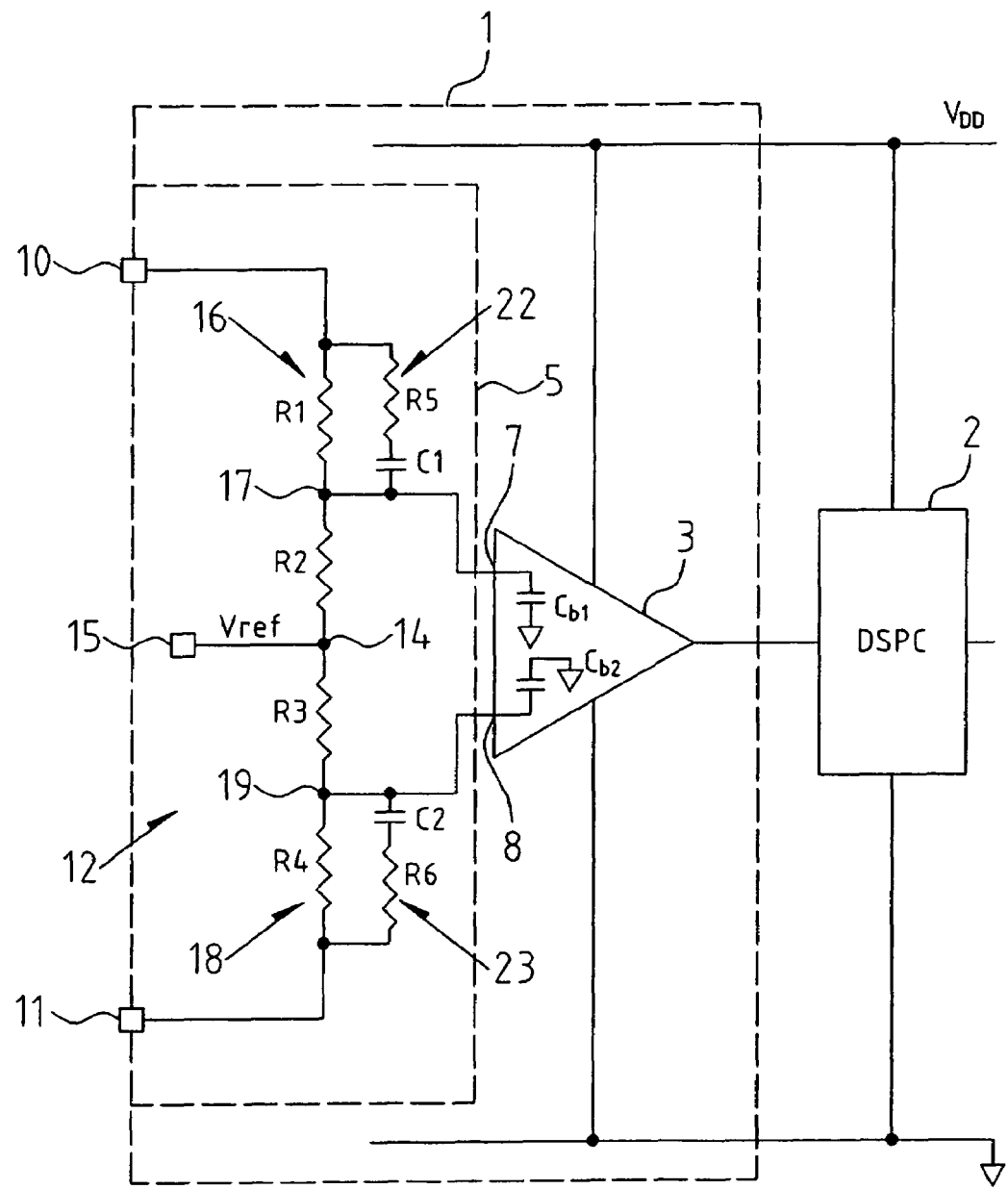
FIG. 1 is a circuit diagram of a differential input stage circuit according to the invention for receiving differential signals from a differential data bus, and for conditioning the differential signals for applying to a digital signal processing circuit, the differential input stage circuit incorporates a voltage level shifting circuit also according to the invention.

Referring to the drawings and initially to FIG. 1 there is illustrated a differential input stage circuit according to the invention indicated generally by the reference numeral 1 for receiving a differential data signal from a high swing common mode level differential data bus (not shown), and for conditioning the differential signal into an appropriate form for applying to a digital signal processing circuit 2. The differential input stage circuit 1 comprises a differential input buffer circuit 3, which in this embodiment of the invention is implemented by a BiCMOS process, and conditions the differential signal, which is then applied to the digital signal processing circuit 2. A voltage level shifting circuit 5 also according to the invention, and also implemented by the BiCMOS process, receives the differential signal from the differential data bus (not shown), and produces a level shifted differential signal with propagation delays minimised, and with the common mode voltage of the level shifted differential signal referenced to a voltage reference $V_{ref}$ derived from the supply voltage $V_{DD}$ of the differential input buffer circuit 3, and thus within the working voltage range of the differential input buffer circuit 3.

The differential input buffer circuit 3 comprises a first differential input 7 and a second differential input 8 for receiving respective first and second signals of a differential signal pair of the level shifted differential signal from the voltage level shifting circuit 5. However, in this embodiment of the invention both the first and second differential inputs 7 and 8 of the differential input buffer circuit 3 have first and second intrinsic input capacitance, respectively, represented by first and second intrinsic input capacitors $C_{b1}$ and $C_{b2}$ which capacitively couple the respective first and second differential inputs 7 and 8 to ground. The values of the first and second intrinsic input capacitance $C_{b1}$ and $C_{b2}$ are similar and in this case, each is of the order of 5 picoFarads. However, it will be appreciated that in some cases the intrinsic input capacitance of the first and second differential inputs may be different to each other, and in which case, the voltage level shifting circuit according to the invention would be appropriately adapted. It will also be appreciated that the voltage level shifting circuit according to the invention may be used in conjunction with differential input buffer circuits of intrinsic input capacitance of values other than 5 picoFarads, and in such cases, the voltage level shifting circuit according to the invention would also be appropriately adapted.

The voltage level shifting circuit 5 comprises a first input terminal 10 and a second input terminal 11 for receiving respective first and second signals of a differential signal pair of the differential signal from the differential data bus (not shown). A resistor string 12 coupled between the first input terminal 10 and the second input terminal 11 comprising series connected first, second, third and fourth string resistors R1 to R4, respectively, defines a centre tap 14 which is coupled to a voltage reference terminal 15. The voltage reference $V_{ref}$ which is derived from the supply voltage $V_{DD}$ of the differential input buffer circuit 3, and to which the common mode voltage of the level shifted differential signal is to be referenced is applied to the voltage reference terminal 15. The first and second string resistors R1 and R2 of the resistor string 12 form a first resistive voltage divider circuit 16 extending between the first input terminal 10 and the voltage reference terminal 15, and define a first output tap 17 on which the first level shifted signal of the first level shifted differential signal pair of the level shifted differential signal is provided. The third and fourth string resistors R3 and R4 of the resistor string 12 form a second resistive voltage divider circuit 18 between the second input terminal 11 and the voltage reference terminal 15, and define a second output tap 19 on which the second level shifted signal of the level shifted differential signal pair of the level shifted differential signal is provided. The first and second level shifted signals of the level shifted differential signal pair on the first and second output taps 17 and 19 are applied to the first and second differential inputs 7 and 8, respectively, of the differential input buffer circuit 3. The resistance of the first string resistor R1 and the fourth string resistor R4 are identical, and the resistance of the second and third string resistors R2 and R3 are identical. In this embodiment of the invention the resistance of the first and second string resistors R1 and R2 sums to 100 Kohms, as does the resistance of the third and fourth string resistors R3 and R4 sum to 100 Kohms. The resistances of the first and second string resistors R1 and R4 are each 90 Kohms, and the resistances of the second and third string resistors R2 and R3 are each 10 Kohms, thus giving a voltage division ratio of one-tenth on the first and second output taps 17 and 19.

The first and second string resistors R1 and R2 of the first resistive voltage divider circuit 16 interact with the first intrinsic input capacitance $C_{b1}$ of the differential input buffer circuit 3 to create a first low pass filter, while the third and fourth string resistors R3 and R4 of the second resistive voltage divider circuit 18 interact with the second intrinsic input capacitance $C_{b2}$ of the differential input buffer circuit 3 to form a second low pass filter. The first and second low pass filters have a cut-off frequency at about 4 MHz above which higher frequency signals are attenuated. It is the first and second low pass filters which result in the propagation delays.

In order to minimise the propagation delays in the level shifted differential signal, first and second high frequency low impedance circuits 22 and 23 are coupled between the first input terminal 10 and the first output tap 17, and the second input terminal 11 and the second output tap 19, respectively. The first high frequency low impedance circuit 22 comprises a first capacitive element, namely, a first capacitor C1, and a first resistive element, namely, a first resistor R5, which are series connected, and are coupled in parallel with the first string resistor R1 of the first resistive voltage divider circuit 16. The second high frequency low impedance circuit 23 comprises a second capacitive element, namely, a second capacitor C2 and a second resistive element, namely, a second resistor R6 connected in series, and coupled in parallel with the fourth string resistor R4 of the second resistive voltage divider circuit 18. The first and second high frequency low impedance circuits 22 and 23 provide respective first and second direct current blocked high frequency low impedance paths to the first and second signals of the differential signal pair from the first and second input terminals 10 and 11 to the first and second differential inputs 7 and 8 of the differential input buffer circuits for minimising propagation delays resulting from the interaction of the first and second resistive voltage divider circuits 16 and 18 with the corresponding first and second intrinsic input capacitance $C_{b1}$ and $C_{b2}$.

The resistance of the first resistor R5 and the capacitance of the first capacitor C1 are selected so that the impedance of the first high frequency low impedance path provided by the first high frequency low impedance circuit 22 between the first input terminal 10 and the first output tap 17 offered to high frequency signals at frequencies at and around the frequencies corresponding to the data rate of the differential signal is less than, and preferably, significantly less than the impedance offered to such high frequency signals by the first resistive divider circuit between the first input terminal 10 and the first output tap 17. Ideally, the values of the first resistor R5 and the first capacitor C1 are selected to provide the first high frequency low impedance circuit 22 with impedance such that the attenuation resulting from a low pass filter created by the interaction of the first resistive voltage divider circuit 16 with the first intrinsic input capacitance $C_{b1}$ of the differential input buffer circuit 3 to signals of frequencies corresponding to the data rate of the differential signal is reduced by at least 1 dB and preferably, by at least 3 dBs. Additionally, the capacitance of the first capacitor C1 can be selected to be of value to be greater than a value produced by the product of the value of the first intrinsic input capacitance $C_{b1}$ of the differential input buffer circuit 3 by the division ratio of the first resistive voltage divider circuit 16, and in this embodiment of the invention the first resistor R5 is selected to be of value of 5 Kohms and the first capacitor C1 is selected to be of value of 1 picoFarad. The impedance of the first high frequency low impedance circuit 22 with the values of the first resistor R5 and the first capacitor C1 of 5 Kohms and 1 picoFarad, respectively, is such as to reduce the attenuation resulting from the low pass filter created by the interaction of the first resistive voltage divider circuit 16 with the first intrinsic input capacitance $C_{b1}$ of the differential input buffer circuit 3 at frequencies around 10 MHz, which corresponds to a data rate of around 20 Mbits per second by approximately 4 dBs, as will be described below with reference to FIG. 4. The selection of the resistance and capacitance values of the second resistor R6 and the second capacitor C2 is similar to that of the first resistor R1 and the first capacitor C1, and in this embodiment of the invention the resistance of the second resistor R2 is 5 Kohms and the capacitance of the second capacitor C2 is 1 picoFarad.

By selecting the high frequency impedance of the first and second high frequency low impedance circuits 22 and 23, and the capacitance of the first and second capacitors C1 and C2 as discussed above, the propagation delay in the level shifted differential signal applied to the first and second differential inputs 7 and 8 of the differential input buffer circuit 3 is minimised. Additionally, the first and second signals of the differential signal pair of the level shifted differential signal applied to the differential input buffer circuit 3 are given a boost at frequencies around 10 MHz, as will be described below with reference to FIGS. 2 to 4, which further contributes to the reduction in the propagation delay in the level shifted differential signal. In addition to the reduction in the propagation delay in the level shifted differential signal provided by the first and second high frequency low impedance circuits 22 and 23, the first and second high frequency low impedance circuits 22 and 23 co-operate with the interaction of the first and second resistive voltage divider circuits 16 and 18 with the first and second intrinsic input capacitance $C_{b1}$ and $C_{b2}$ of the differential input buffer circuit 3 to create respective first and second low pass filters, which attenuate frequency components in the differential signal at frequencies above the cut-off frequencies of the first and second low pass filters, thereby filtering out noise in the differential signal at such frequencies.

In order to provide a better understanding of the voltage level shifting circuit 5 according to the invention, and in particular, the action of the first and second high frequency low impedance circuits 22 and 23, three computer simulations of the voltage level shifting circuit 5 which has been described with reference to FIG. 1 have been made. A computer simulation of a prior art voltage level shifting circuit identical to the voltage level shifting circuit 5 described with reference to FIG. 1 but with the first and second high frequency low impedance circuits omitted has also been made. In each computer simulation of the voltage level shifting circuit 5 and the prior art voltage level shifting circuit, the first and second output taps of the respective voltage level shifting circuits were coupled to corresponding first and second differential inputs of identical differential input buffer circuits, each of which had respective first and second intrinsic input capacitance of 5 picoFarads, similar to the differential input buffer circuit 3.

In each computer simulation of the voltage level shifting circuit 5 and the prior art voltage level shifting circuit the values of the first to the fourth string resistors R1, R2, R3 and R4 were as described in the voltage level shifting circuit 5 of FIG. 1. In each of the three computer simulations of the voltage level shifting circuit 5 of FIG. 1 the values of the first and second resistors R5 and R6 were as described with reference to FIG. 1. However, the values of the first and second capacitors C1 and C2 were altered in the three computer simulations. In one computer simulation the value of each of the first and second capacitors C1 and C2 was 1 picoFarad, in another computer simulation the value of each of the first and second capacitors C1 and C2 was 0.1 picoFarad, and in a third computer simulation the value of each of the first and second capacitors C1 and C2 was 5 picoFarads. In each computer simulation of the voltage level shifting circuit 5 and the prior art voltage level shifting circuit a differential signal at a high data rate was applied to the first and second input terminals of the respective voltage level shifting circuits for the purpose of demonstrating the reduction in the propagation delay in the voltage level shifting circuit 5 over the propagation delay in the prior art voltage level shifting circuit.

Figure 2:
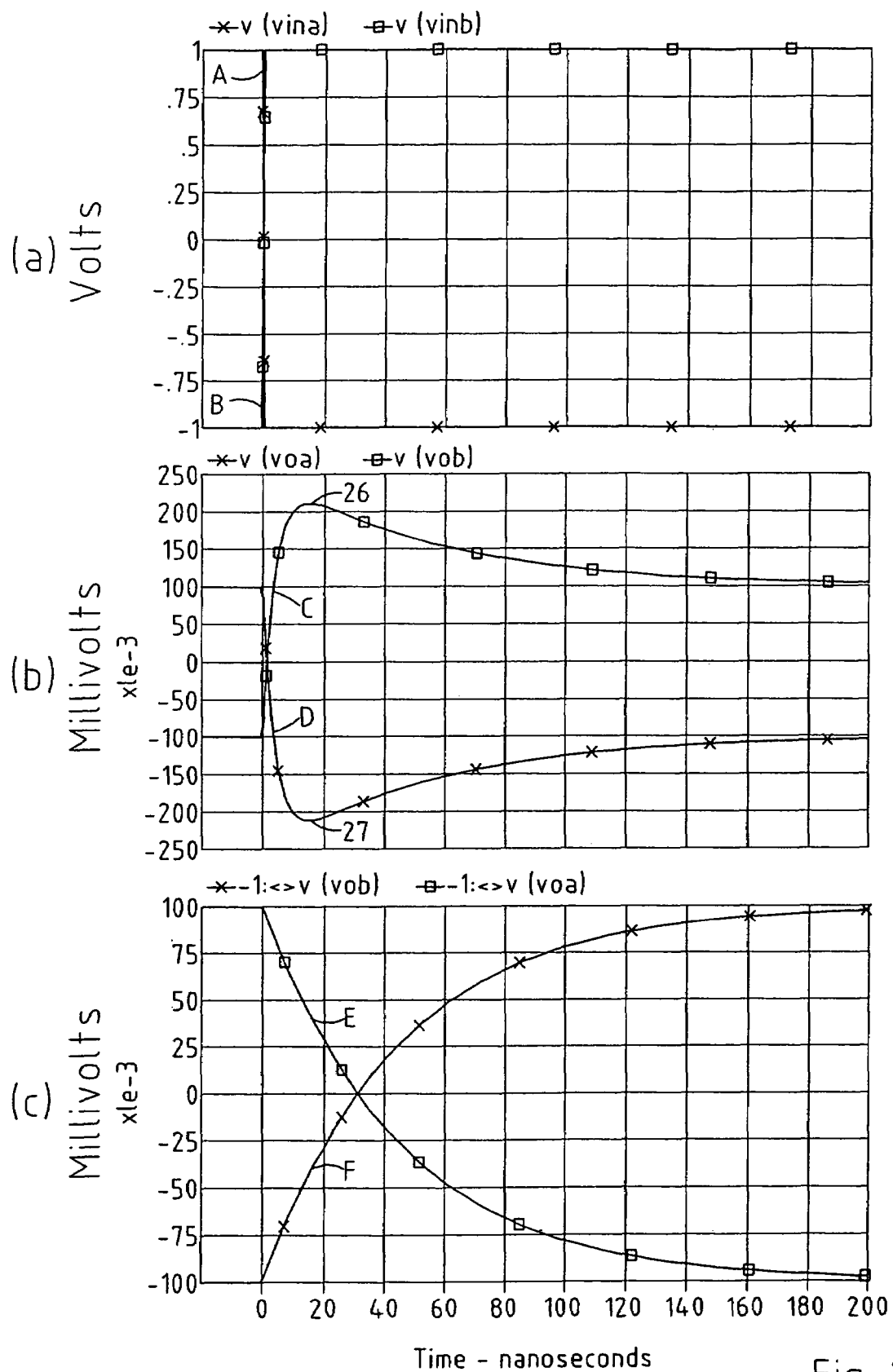
FIGS. 2(a) to 2(c) illustrate waveforms resulting from computer simulations of the voltage level shifting circuit according to the invention, and a prior art voltage level shifting circuit.
Figure 3:
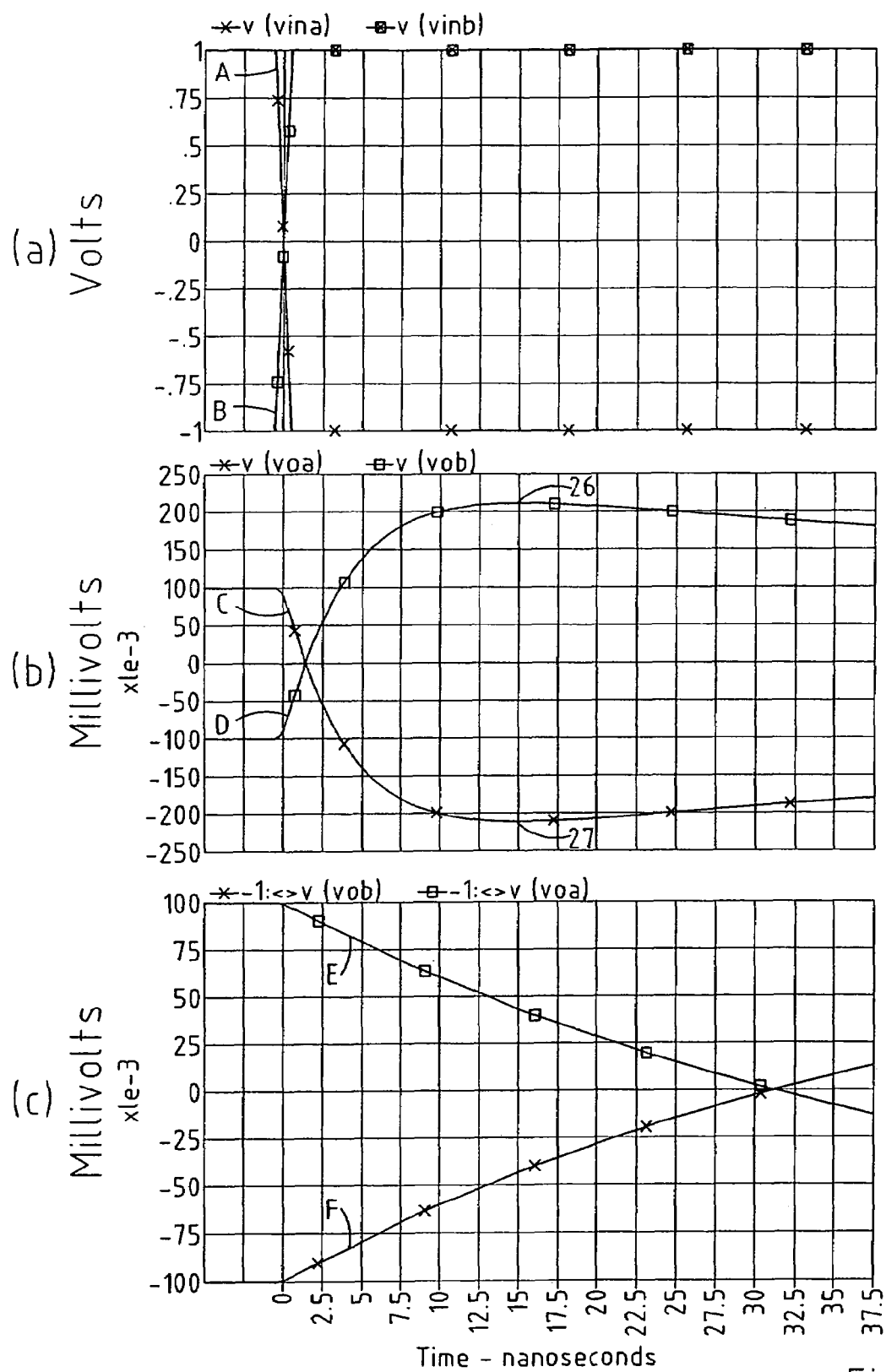
FIGS. 3(a) to 3(c) illustrate waveforms similar to those of FIGS. 3(a) to 3(c) but of higher resolution.
Figure 4:
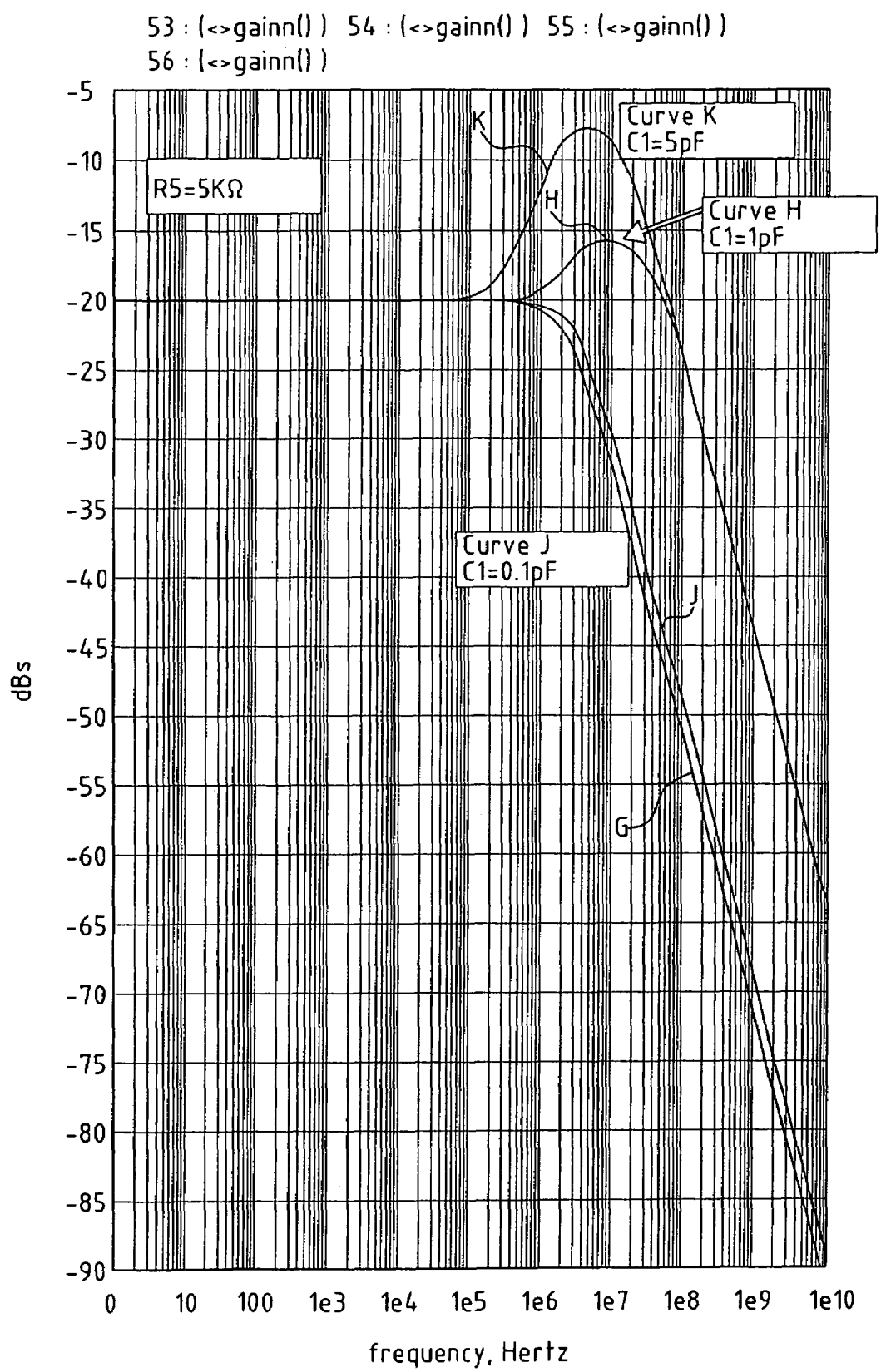
FIG. 4 illustrates waveforms resulting from computer simulations of the voltage level shifting circuit according to the invention and a prior art voltage level shifting circuit.

Waveforms resulting from the simulations are illustrated in FIGS. 2 to 4. However, in FIGS. 2 and 3 the waveforms relating to the simulation of the voltage level shifting circuit 5 according to the invention are those resulting from the computer simulation in which the values of the first and second capacitor C1 and C2 were each 1 picoFarad.

Referring now to FIGS. 2(a) to 2(c) and 3(a) to 3(c), waveforms representing one data transition of the differential signal applied to the first and second input terminals 10 and 11 in the computer simulations of the voltage level shifting circuit 5 and the prior art voltage level shifting circuit are illustrated. FIGS. 3(a) to 3(c) illustrate portions of the respective waveforms at a higher resolution to that of FIGS. 2(a) to 2(c). In the computer simulation of the voltage level shifting circuit 5 the value of the first and second capacitors C1 and C2 were 1 picoFarad. In FIGS. 2(a) and 3(a), waveforms A and B represent the data transition of the first and second signals of the differential signal pair of the differential signal which was applied to the voltage level shifting circuit 5 and the prior art voltage level shifting circuit. The waveforms C and D of FIGS. 2(b) and 3(b) represent the corresponding data transition of the first and second level shifted signals of the level shifted differential signal pair applied by the voltage level shifting circuit 5 to the first and second differential inputs 7 and 8 of the differential input buffer circuit 3. The waveforms E and F of FIGS. 2(c) and 3(c) represent the corresponding data transition of the first and second level shifted signals of the level shifted differential signal pair applied to the first and second differential inputs 7 and 8 of the differential input buffer circuit 3 by the prior art voltage level shifting circuit. In FIGS. 2(a) and 3(a) the voltage of the first and second signals of the differential signal which is applied to the first and second terminals 10 and 11 of the respective voltage level shifting circuits is plotted on the Y-axis in volts. The voltage of the first and second signals of the voltage level shifted differential signals applied by the respective voltage level shifting circuits to the differential input buffer circuit 3 is plotted on the Y-axis in millivolts in FIGS. 2(b) and 2(c) and 3(b) and 3(c). Time in nanoseconds is plotted on the X-axis of FIGS. 2(a), 2(b) and 2(c), and 3(a), 3(b) and 3(c).

As can be seen from the waveforms A and B, and C and D in FIGS. 2(a) and 3(a) and 2(b) and 3(b), the time delay from the change in the polarity of the differential signal A and B of FIGS. 2(a) and 3(a) applied to the input terminals 10 and 11 of the voltage level shifting circuit 5 to the corresponding change in the polarity of the level shifted differential signal C and D applied to the differential input buffer circuit 3 by the voltage level shifting circuit 5 is 1.5 nanoseconds. Accordingly, the voltage level shifting circuit 5 applies the level shifted differential signal to the differential input buffer circuit 3 with a propagation delay of approximately 1.6 nanoseconds. However, from the waveforms A and B and E and F in FIGS. 2(a) and 3(a) and 2(c) and 3(c), it can be seen that the corresponding propagation delay for the prior art voltage level shifting circuit 5 is approximately 30 nanoseconds. Thus, the provision of the first and second high frequency low impedance circuits 22 and 23 in the voltage level shifting circuit 5 results in the propagation delay being reduced by a factor of almost 30 over the propagation delay incurred in the prior art voltage level shifting circuit.

Referring now to FIG. 4, the effect of the first high frequency low impedance circuit 22 in altering the attenuation resulting from the low pass filter created by the interaction of the first resistive voltage divider circuit 16 with the first intrinsic input capacitance $C_{b1}$ will now be described with reference to the computer simulations. The effect of the second high frequency low impedance circuit 23 on the low pass filter created by the interaction of the second resistive voltage divider circuit 18 with the second intrinsic input capacitance $C_{b2}$ is identical to that of the first high frequency low impedance circuit 22 on the interaction of the first resistive voltage divider circuit 16 with the first intrinsic input capacitance $C_{b1}$ in creating the corresponding low pass filter. Waveforms G, H, J and K of FIG. 4 represent characterisations of the first low pass filters created by the interaction of the first intrinsic input capacitance $C_{b1}$ of the differential input buffer circuit 3 with the prior art voltage level shifting circuit and the voltage level shifting circuit 5 from the computer simulations. In FIG. 4 the gain of the amplitude of the first level shifted signal of the level shifted differential signal pair applied to the first differential input 7 of the differential input buffer circuit 3 by the voltage level shifting circuits is plotted on the Y-axis in decibels. Frequency of the differential signal is plotted on a log to the base ten scale on the X-axis.

The waveform G is a characterisation of the first low pass filter created by the interaction of the first resistive voltage divider circuit of the prior art voltage level shifting circuit with the first intrinsic input capacitance $C_{b1}$ of the differential input buffer circuit 3. The waveform H is a characterisation of the first low pass filter created by the interaction of the first high frequency low impedance circuit 22 and the first resistive voltage divider circuit 16 of the voltage level shifting circuit 5 with the first intrinsic input capacitance $C_{b1}$ of the differential input buffer circuit 3. The waveform H was produced by setting the value of the first capacitor C1 at 1 picoFarad. The waveform J is a characterisation of the first low pass filter created by the interaction of the first high frequency low impedance circuit 22 and the first resistive voltage divider circuit 16 of the voltage level shifting circuit 5 with the first intrinsic input capacitance $C_{b1}$ of the differential input buffer circuit 3. The waveform J was produced by setting the value of the first capacitor C1 at 0.1 picoFarads. The waveform K of FIG. 3 is a characterisation of the first low pass filter created by the interaction of the first high frequency low impedance circuit 22 and the first resistive voltage divider circuit 16 of the voltage level shifting circuit 5 with the first intrinsic input capacitance $C_{b1}$ of the differential input buffer circuit 3. The waveform K was produced by setting the value of the first capacitor C1 at 5 picoFarads.

As can be seen from the waveform G, the cut-off frequency at which the gain of the first level shifted signal of the level shifted differential signal pair rolls off by 3 dB resulting from the first low pass filter created by the interaction of the prior art voltage level shifting circuit with the first intrinsic input capacitance $C_{b1}$ of the differential input buffer circuit 3 is approximately 4 MHz. However, from the waveform H it can be seen that when the first capacitor C1 is of 1 picoFarad the corresponding cut-off frequency of the first low pass filter created by the interaction of the voltage level shifting circuit 5 with the first intrinsic input capacitance $C_{b1}$ of the differential input buffer circuit 3 is approximately 100 MHz. Accordingly, by providing the first high frequency low impedance circuit 22 with a first capacitor of capacitance of 1 picoFarad, the cut-off frequency produced by the first low pass filter is increased from 4 MHz to 100 MHz over the prior art voltage level shifting circuit. Furthermore, from the waveform H it can be seen that the provision of the first high frequency low impedance circuit 22 reduces the attenuation of the signal at frequencies centred around 10 MHz, which results in a minimum peak attenuation value of approximately 16 decibels. This reduction in the attenuation of the differential signal by 4 dBs at frequencies centred around 10 MHz results in a boost in the first signal of the level shifted differential signal pair of differential signals at data rates centred around 20 Mbits per second. This boost results in a peak 26 in the waveform C of FIGS. 2(b) and 3(b), which can be most clearly seen in FIG. 2(b). The provision of the second high frequency low impedance circuit 23 results in a similar boost to the second signal of the level shifted differential signal pair, which in turn results in a peak 27 in the waveform D of FIGS. 2(b) and 3(b). The boost in the first and second signals of the level shifted differential signal pair which results in the peaks 26 and 27 in the waveforms C and D of FIGS. 2(b) and 3(b) also contributes to the reduction in the propagation delay produced by the voltage level shifting circuit 5.

As can be seen from the waveform K of FIG. 4, increasing the capacitance of the first capacitor C1 of the first high frequency low impedance circuit 22 to 5 picoFarads further reduces the attenuation of components in the differential signal at frequencies centred around 10 MHz, and a minimum peak value of attenuation of approximately 7.5 decibels is achieved at a frequency of approximately 5 MHz. This reduction in the attenuation of the first signal of the level shifted differential signal pair gives a corresponding boost to the first signal of the level shifted differential signal pair similar to that represented by the peaks 26 and 27 of the waveforms C and D of FIGS. 2(b) and 3(b). This boost to the first signal of the level shifted differential signal pair, and a corresponding boost to the second signal of the level shifted differential signal pair, which is achieved by providing the second capacitor C2 of the high frequency low impedance circuit 23 with a capacitance of 5 picoFarads, results in the propagation delay being reduced to 1.5 nanoseconds, which is only a marginal improvement over that achieved by the voltage level shifting circuit 5 with the values of the first and second capacitors set at 1 picoFarad each.

Additionally, it can be seen from the waveforms H and K that the interaction of the first high frequency low impedance circuit 22 and the first resistive voltage level shifting circuit 16 with the first intrinsic input capacitance $C_{b1}$ of the differential input buffer circuit 3 create a first low pass filter with a cut-off frequency of approximately 100 MHz. Thus, as well as significantly reducing the propagation delay in the level shifted differential signal applied to the differential input buffer circuit 3, the interaction of the first and second high frequency low impedance circuits 22 and 23 and the first and second resistive voltage divider circuits 16 and 18 with the corresponding first and second intrinsic input capacitance $C_{b1}$ and $C_{b2}$ also act to filter out noise in the differential signal above the cut-off frequencies of the first and second low pass filters.

As can be seen from the waveform J of FIG. 4, when the value of the first capacitor C1 of the first high frequency low impedance circuit 22 is reduced to 0.1 picoFarads, little benefit is achieved from the first high frequency low impedance circuit 22. Thus, in the present case, with the first and second intrinsic input capacitance $C_{b1}$ and $C_{b2}$ of the differential input buffer circuit 3 being of 5 picoFarads, and the resistances of the first to the fourth string resistors R1 and R4 of the first and second resistive voltage divider circuits 16 and 18 being as described with reference to FIG. 1, the optimum values for the first and second capacitors C1 and C2 of the first and second high frequency low impedance circuits 22 and 23 lies in the range of 1 picoFarad to 5 picoFarads. However, it will be readily apparent to those skilled in the art that with different values of first and second intrinsic input capacitance of the differential input buffer circuit and with different resistance values of the first and second resistive voltage divider circuits, other appropriate values of first and second resistors R5 and R6 and first and second capacitors C1 and C2 would be selected, and their selection will be understood by those skilled in the art.

In use, the voltage reference $V_{ref}$ which is derived from the supply voltage $V_{DD}$ of the differential input stage circuit 1 is applied to the voltage reference terminal 15. The first and second input terminals 10 and 11 are coupled to the differential data bus (not shown) for receiving the first and second signals of the differential signal pair from the differential data bus. The first and second level shifted signals of the level shifted differential signal pair are derived from the first and second output taps 17 and 19 with the common mode voltage of the level shifted differential signal referenced to the voltage reference $V_{ref}$ on the voltage reference terminal 15. The first and second level shifted signals of the level shifted differential signal pair of the level shifted differential signal on the first and second output taps 17 and 19 are applied to the first and second differential inputs 7 and 8, respectively, of the differential input buffer circuit 3 for conditioning prior to being applied to the digital signal processing circuit 2. As has been described with reference to FIGS. 2 to 4, the first and second level shifted signals of the level shifted differential signal pair are applied to the first and second differential inputs 7 and 8 of the differential input buffer circuit 3 with propagation delays minimised.

Referring now to FIGS. 5 to 8, input stage circuits, indicated generally by the reference numerals 30, 40, 50 and 60, respectively, according to other embodiments of the invention are illustrated. The input stage circuits 30, 40, 50 and 60 are substantially similar to the input stage circuit 1 and similar components are identified by the same reference numerals. The input stage circuits 30, 40, 50 and 60 comprise respective voltage level shifting circuits, also according to other embodiments of the invention which are indicated by the reference numerals 31, 41, 51 and 61, respectively. The voltage level shifting circuits 31, 41, 51 and 61 are substantially similar to the voltage level shifting circuit 5 of FIG. 1, and similar components are identified by the same reference numerals. The main difference between the voltage level shifting circuits 31, 41, 51 and 61 and the voltage level shifting circuit 5 of FIG. 1 is that one or more of the resistors of the first and second resistive voltage circuits 16 and 18 between the first input terminal and the first output tap 17, and the second input terminal 11 and the second output tap 19, respectively, are shared with the corresponding one of the first and second high frequency low impedance circuits 22 and 23.

Figure 5:
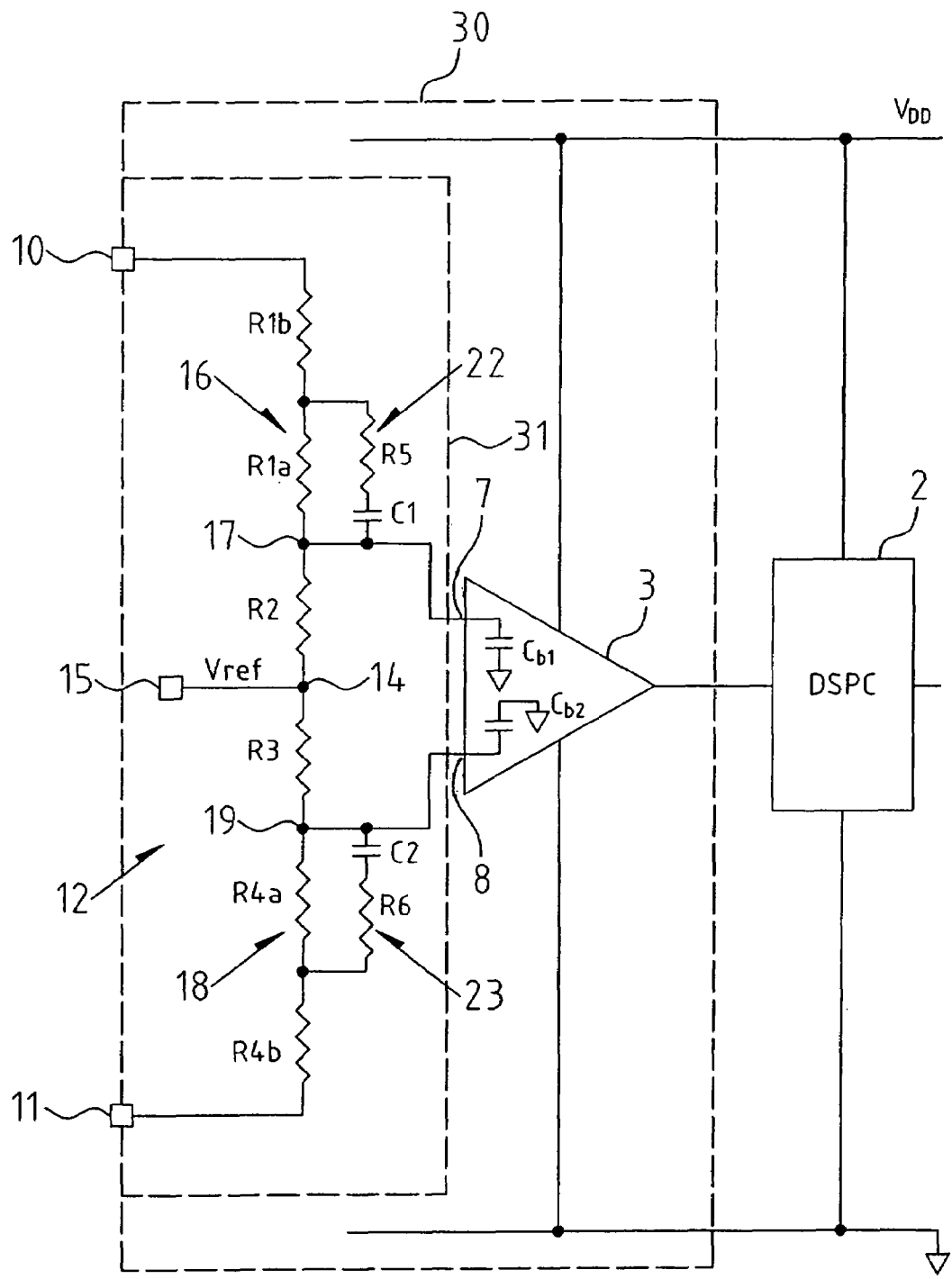
FIG. 5 is a circuit diagram similar to FIG. 1 of a differential input stage circuit according to another embodiment of the invention.

In the voltage level shifting circuit 31 of FIG. 5, the first string resistor R1 and the fourth string resistor R4 are provided as first string resistors R1a and R1b, and fourth string resistors R4a and R4b, respectively. The first string resistor R1b is shared by the first resistive voltage divider circuit 16 and the first high frequency low impedance circuit 22, while the fourth string resistor R4b is shared by the second resistive voltage divider circuit 18 and the second high frequency low impedance circuit 23.

Figure 6:
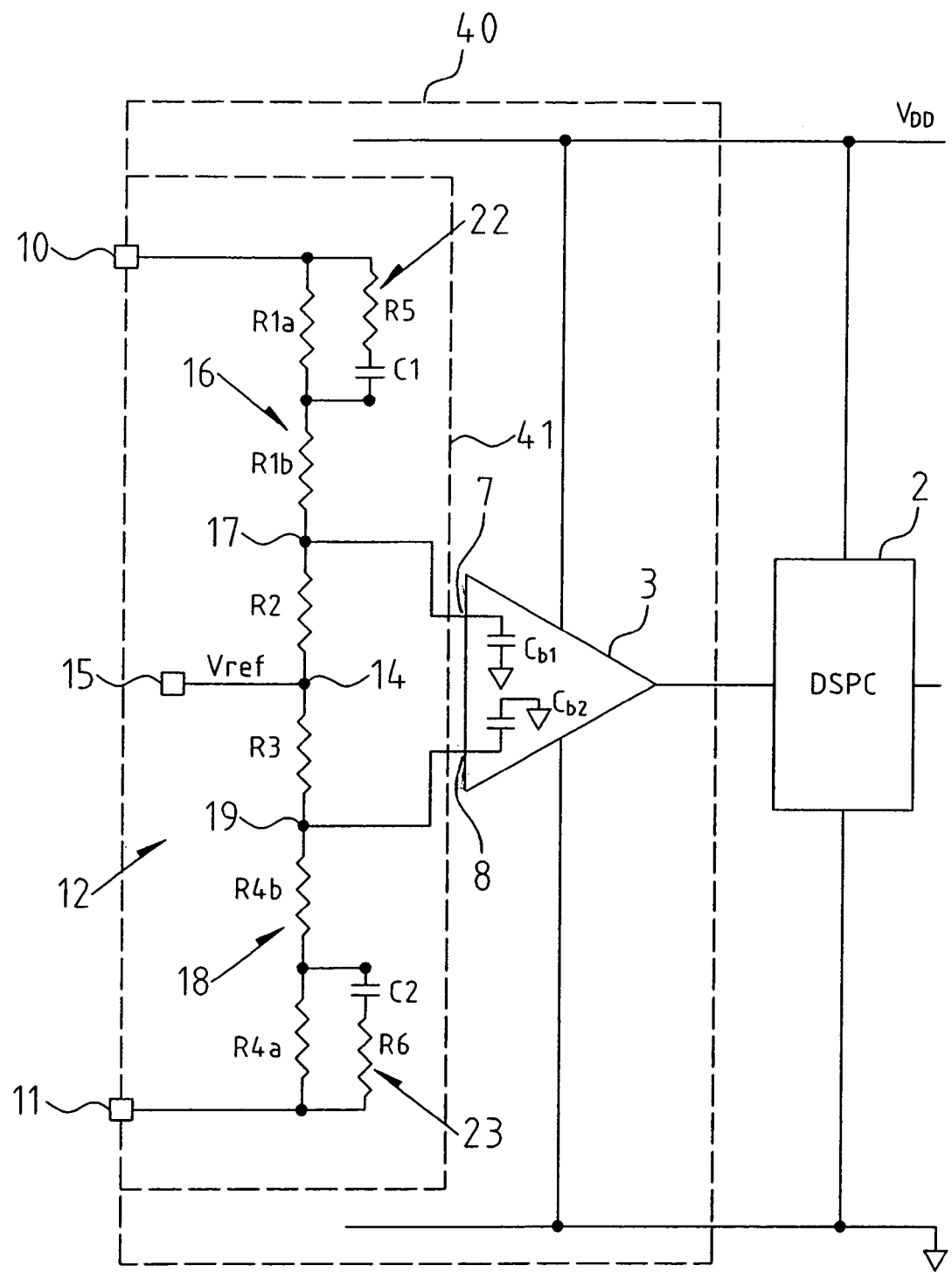
FIG. 6 is a circuit diagram similar to FIG. 1 of a differential input stage circuit according to a further embodiment of the invention.

Similarly, in the case of the voltage level shifting circuit 41 of FIG. 6, the first and fourth string resistors R1b and R4b are similarly shared by the first resistive voltage divider circuit 16 and the first high frequency low impedance circuit 22, and the second resistive voltage divider circuit 18 and the second high frequency low impedance circuit 23, respectively.

Figure 7:
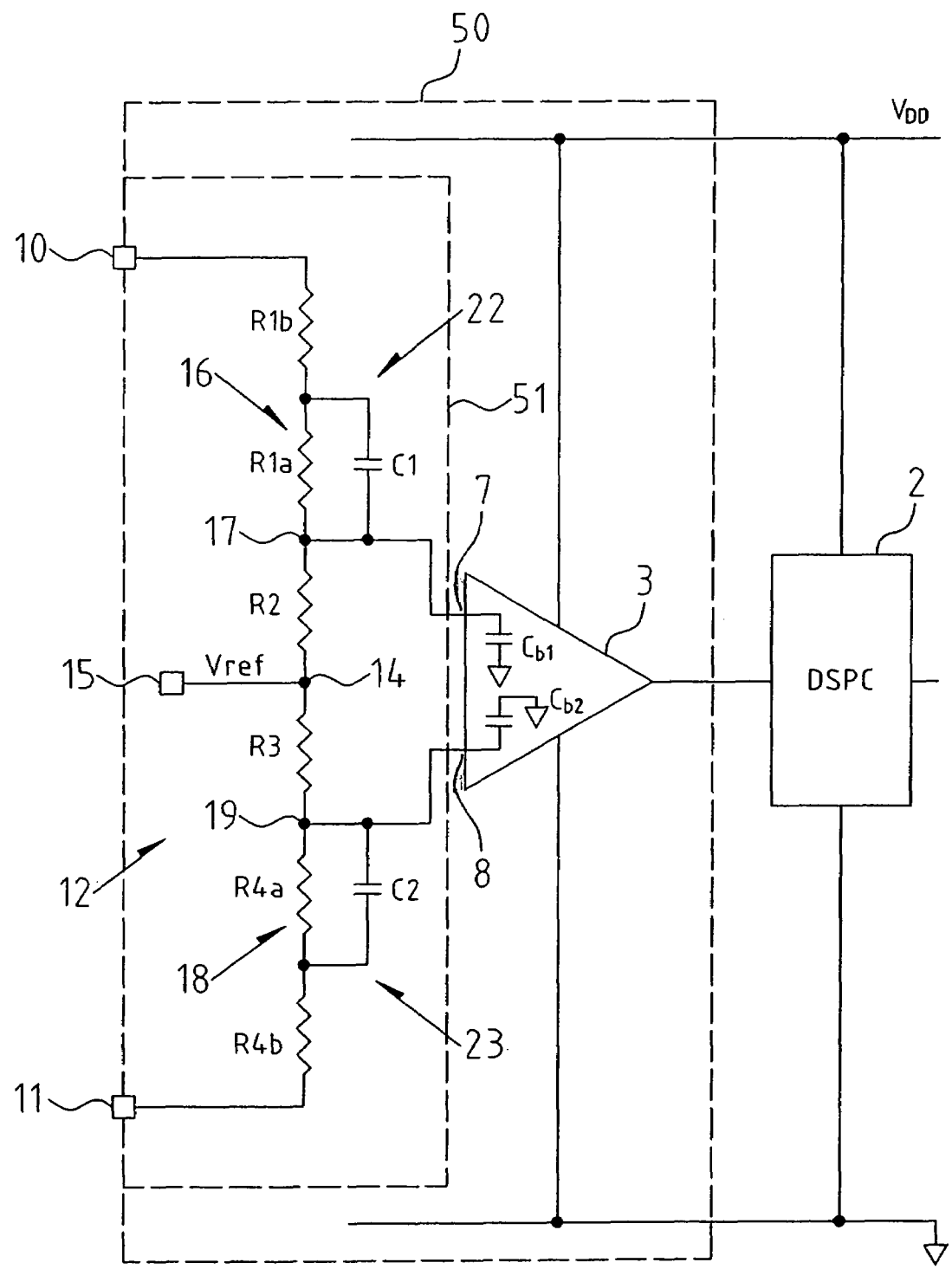
FIG. 7 is a circuit diagram similar to FIG. 1 of a differential input stage circuit according to a further embodiment of the invention.

In the voltage level shifting circuit 51 of FIG. 7 the first and fourth string resistors R1b and R4b are also shared by the corresponding first resistive voltage divider circuit 16 and the first high frequency low impedance circuit 22, and the second resistive voltage divider circuit 18 and the second high frequency low impedance circuit 23, respectively. However, in this embodiment of the invention the first string resistor R1b and the fourth string resistor R4b act entirely in place of the first and second resistors R5 and R6, respectively, in the first and second high frequency low impedance circuits 22 and 23.

Figure 8:
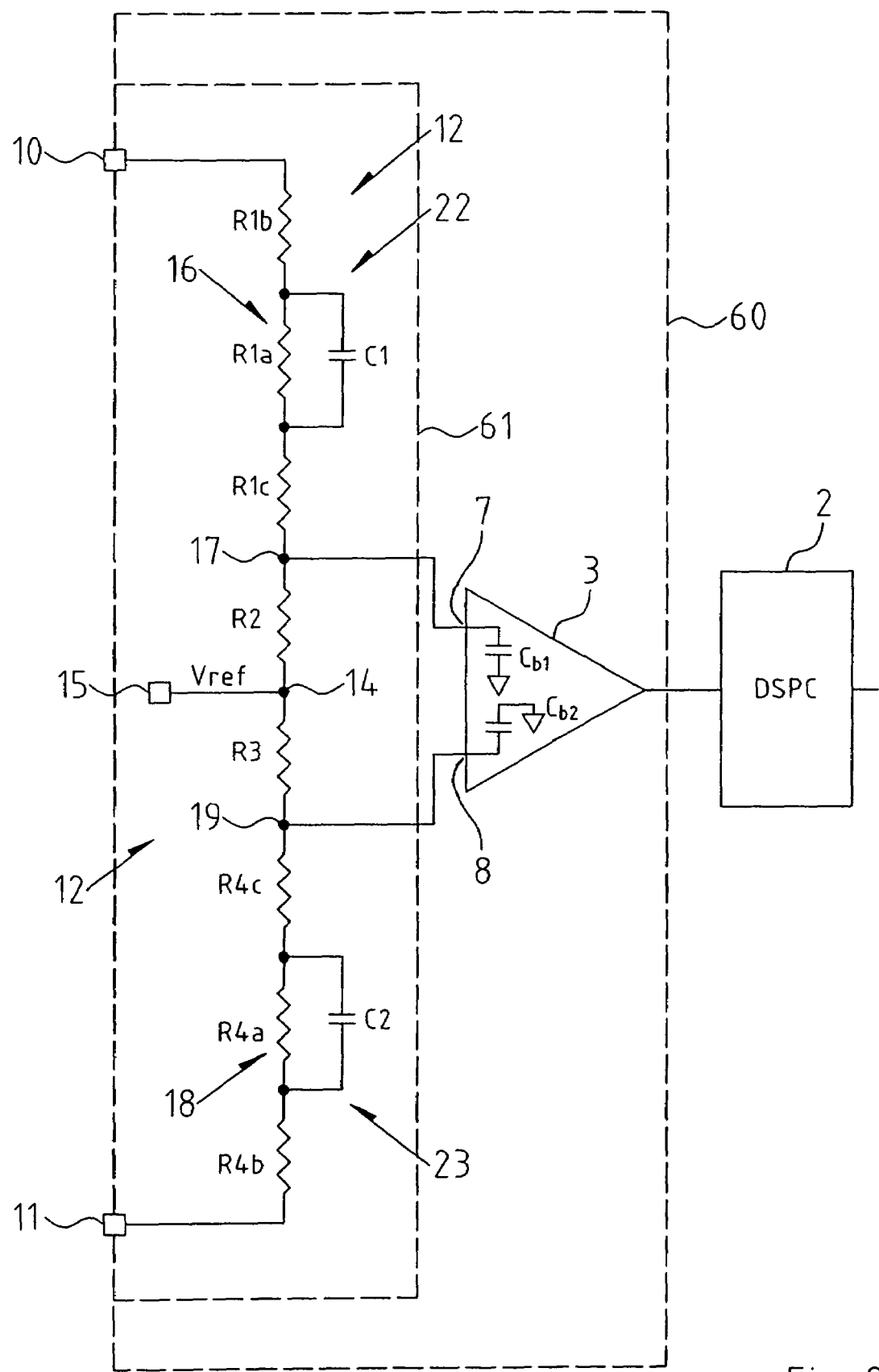
FIG. 8 is a circuit diagram similar to FIG. 1 of a differential input stage circuit according to another embodiment of the invention.

In the voltage level shifting circuit 61 of FIG. 8 the first and fourth string resistors R1 and R4 are each provided by three resistors, namely, R1a, R1b and R1c, and R4a, R4b and R4c, respectively. In this embodiment of the invention the first string resistors R1b and R1c are shared by the first resistive voltage divider circuit 16 and the first high frequency low impedance circuit 22, while the fourth string resistors R4b and R4c are shared by the second resistive voltage divider circuit 18 and the second high frequency low impedance circuit 23. Additionally, in the voltage level shifting circuit 61 the first and fourth resistors R1b and R1c and R4b and R4c replace the first and second resistors R5 and R6, respectively, in the first and second high frequency low impedance circuits 22 and 23 in their entirety. The selection of the resistive values of the first and fourth string resistors R1a, R1b and R1c, and R4a, R4b and R4c, respectively, as the case may be, and the resistive values of the first and second resistors R5 and R6, as the case may be, as well as the resistive values of the second and third string resistors R2 and R3 in the voltage level shifting circuits 31, 41, 51 and 61 of FIGS. 5 to 8 will be readily apparent to those skilled in the art.

The advantage of providing the first and fourth string resistors R1b and R4b and/or the first and second resistors R5 and R6 as the case may be between the first and second capacitors C1 and C2, respectively, and the corresponding first and second input terminals 10 and 11 is that the first and fourth string resistors R1b and R4b and/or the first and second resistors R5 and R6 provide electrostatic discharge protection for the first and second capacitors C1 and C2, the voltage level shifting circuits and to the differential input buffer circuit 3.

While various implementations of the voltage level shifting circuit according to the invention have been described with reference to FIGS. 1 and 5 to 8, it will be readily apparent to those skilled in the art that other implementations could be implemented. For example, in the embodiment of the voltage level shifting circuit described with reference to FIGS. 7 and 8, the first and second resistors R5 and R6 of appropriate values could be included in series with the corresponding ones of the first and second capacitors C1 and C2. In which case, the series connected first resistor R5 and first capacitor C1 would be coupled in parallel with the first string resistor R1a, and the series connected second resistor R6 and second capacitor C2 would be coupled in parallel with the fourth string resistor R4a. Needless to say, other implementations of the voltage level shifting circuit will be readily apparent to those skilled in the art.

With the voltage level shifting circuits according to the invention with values of the components described with reference to the voltage level shifting circuit 5 of FIG. 1, the voltage level shifting circuits are particularly suitable for use with high swing common mode voltage differential data buses, for example, a differential data bus conforming to the RS 485 standard. However, it will be readily apparent to those skilled in the art, that by appropriately altering the values of the components of the voltage level shifting circuits, the voltage level shifting circuits according to the invention would be suitable for level shifting differential signals from differential data buses operating to other standards.

While the voltage level shifting circuits according to the invention and the differential input buffer circuits have been described as being implemented by a BiCMOS process, the circuits may be produced by any other suitable process.

Additionally, while the first and second resistive voltage divider circuits have been described as being similar to each other, and the first and second high frequency low impedance circuits have been described as being similar to each other, in certain cases, it is envisaged that the first and second resistive voltage divider circuits may be different to each other, and in which case, the first and second high frequency low impedance circuits would likewise be different to each other.

Indeed, in cases where a differential input buffer circuit is provided with first and second intrinsic input capacitance which were different to each other, the first and second high frequency low impedance circuits would be correspondingly different to each other.

While the voltage level shifting circuits described with reference to the drawings have been described as being particularly suitable for reducing propagation delays at a data rate of the order of 20 Mbits per second, it will be readily apparent to those skilled in the art that the reduction in the propagation delays are applicable to differential signals of data rates from the very low data rates below 5 Mbits per second to data rates in the order of many Gbits per second.

The invention claimed is:

1. A voltage level shifting circuit for level shifting a differential signal with a common mode voltage of the level shifted differential signal referenced to a voltage reference and for applying the level shifted differential signal to a differential input buffer circuit with propagation delays minimised, the differential input buffer circuit comprising first and second differential inputs for receiving the level shifted differential signal from the voltage level shifting circuit, the first and second differential inputs of the differential input buffer circuit having respective first and second intrinsic input capacitance, the voltage level shifting circuit comprising:

a first input terminal for receiving a first signal of a differential signal pair of the differential signal;

a second input terminal for receiving a second signal of the differential signal pair of the differential signal;

a first resistive voltage divider circuit coupled between the first input terminal and a voltage reference terminal for receiving the voltage reference;

a second resistive voltage divider circuit coupled between the second input terminal and the voltage reference terminal;

first and second output taps formed, respectively, by the respective first and second resistive voltage divider circuits, on which taps are produced respective first and second level shifted signals of a level shifted differential signal pair of the level shifted differential signal with the common mode voltage thereof referenced to the voltage reference for applying to the first and second differential inputs, respectively, of the differential input buffer circuit;

a first high-frequency-low-impedance circuit forming a direct-current-blocked, high-frequency-low-impedance pathway forming at least part of a path between the first input terminal and the first output tap for accommodating the first signal of the differential signal pair from the first input terminal to the first output tap with propagation delays minimised when the first level shifted signal of the level shifted differential signal pair is applied to the first differential input of the differential input buffer circuit, the first high-frequency-low-impedance circuit and the first resistive voltage divider circuit co-operating with the first intrinsic input capacitance of the first differential input of the differential input buffer circuit to form a first low pass filter;

wherein the impedance of the first high-frequency-low-impedance circuit is selected so that attenuation resulting from the first low pass filter at frequencies corresponding to a data rate of the differential signal is reduced by at least 1 dB relative to a nominal attenuation level applied to signals at frequencies substantially below the data rate;

a second high-frequency-low-impedance circuit forming a direct-current-blocked, high-frequency-low-impedance pathway forming at least part of a path between the second input terminal and the second output tap for accommodating the second signal of the differential signal pair from the second input terminal to the second output tap for minimising propagation delays when the second level shifted signal of the level shifted differential signal pair is applied to the second differential input of the differential input buffer circuit, the second high-frequency-low-impedance circuit and the second resistive voltage divider circuit co-operating with the second intrinsic input capacitance of the second differential input of the differential input buffer circuit to form a second low pass filter; and the first and second low pass filters acting to filter out noise in the differential signal at frequencies above the cut-off frequencies of the first and second low pass filters.

2. A voltage level shifting circuit as claimed in claim 1 in which the first high-frequency-low-impedance circuit is coupled in parallel with at least a portion of the first resistive voltage divider circuit extending between the first input terminal and the first output tap.

3. A voltage level shifting circuit as claimed in claim 1 in which the first high-frequency-low-impedance circuit is coupled in parallel with the first resistive voltage divider circuit extending between the first input terminal and the first output tap.

4. A voltage level shifting circuit as claimed in claim 1 in which the first high-frequency-low-impedance circuit comprises a first capacitive element.

5. A voltage level shifting circuit as claimed in claim 4 in which the first high-frequency-low-impedance circuit comprises a first resistive element coupled in series with the first capacitive element.

6. A voltage level shifting circuit as claimed in claim 5 in which the first resistive element is provided by a portion of the first resistive voltage divider circuit extending between the first input terminal and the first output tap.

7. A voltage level shifting circuit as claimed in claim 5 in which the first resistive element is coupled between the first input terminal and the first capacitive element.

8. A voltage level shifting circuit as claimed in claim 5 in which values of the first resistive element and the first capacitive element are selected so that the impedance offered by the first high-frequency-low-impedance circuit to signals of frequency corresponding to the data rate of the differential signal is less than an impedance offered to signals of such frequency by a portion of the first resistive voltage divider circuit between the first input terminal and the first output tap.

9. A voltage level shifting circuit as claimed in claim 1 in which the impedance of the first high-frequency-low-impedance circuit is selected so that the attenuation resulting from the first low pass filter at frequencies corresponding to the data rate of the differential signal is reduced by at least 3 dB relative to a nominal attenuation level applied to signals at frequencies substantially below the data rate.

10. A voltage level shifting circuit as claimed in claim 4 in which a value of the first capacitive element is selected to be greater than a value produced by a product of a value of the first intrinsic input capacitance of the differential input buffer circuit by a division ratio of the first resistive voltage divider circuit.

11. A voltage level shifting circuit as claimed in claim 1 in which the second high-frequency-low-impedance circuit is coupled in parallel with at least a portion of the second resistive voltage divider circuit extending between the second input terminal and the second output tap.

12. A voltage level shifting circuit as claimed in claim 1 in which the second high-frequency-low-impedance circuit is coupled in parallel with the second resistive voltage divider circuit extending between the second input terminal and the second output tap.

13. A voltage level shifting circuit as claimed in claim 1 in which the second high-frequency-low-impedance circuit comprises a second capacitive element.

14. A voltage level shifting circuit as claimed in claim 13 in which the second high-frequency-low-impedance circuit comprises a second resistive element coupled in series with the second capacitive element.

15. A voltage level shifting circuit as claimed in claim 14 in which the second resistive element is provided by a portion of the second resistive voltage divider circuit extending between the second input terminal and the second output tap.

16. A voltage level shifting circuit as claimed in claim 14 in which the second resistive element is coupled between the second input terminal and the second capacitive element.

17. A voltage level shifting circuit as claimed in claim 14 in which values of the second resistive element and the second capacitive element are selected so that the impedance offered by the second high-frequency-low-impedance circuit to signals of frequency corresponding to the data rate of the differential signal is less than an impedance offered to signals of such frequency by a portion of the second resistive voltage divider circuit between the second input terminal and the second output tap.

18. A voltage level shifting circuit as claimed in claim 1 in which the impedance of the second high-frequency-low-impedance circuit is selected so that attenuation resulting from the second low pass filter at frequencies corresponding to the data rate of the differential signal is reduced by at least 1 dB relative to a nominal attenuation level applied to signals at frequencies substantially below the data rate.

19. A voltage level shifting circuit as claimed in claim 18 in which the impedance of the second high-frequency-low-impedance circuit is selected so that the attenuation resulting from the second low pass filter at frequencies corresponding to the data rate of the differential signal is reduced by at least 3 dB relative to a nominal attenuation level applied to signals at frequencies substantially below the data rate.

20. A voltage level shifting circuit as claimed in claim 13 in which a value of the second capacitive element is selected to be greater than a value produced by a product of a value of the second intrinsic input capacitance of the differential input buffer circuit by a division ratio of the second resistive voltage divider circuit.

21. A voltage level shifting circuit as claimed in claim 1 in which the first and second high-frequency-low-impedance circuits are adapted for accommodating first and second signals of the differential signal pair of the differential signal at the data rate of at least 5 Mbits per second.

22. A differential input stage circuit comprising:
a differential input buffer circuit having first and second differential inputs with respective first and second intrinsic input capacitance;
a voltage level shifting circuit for level shifting a differential signal with a common mode voltage of the level shifted differential signal referenced to a voltage reference and for applying the level shifted differential signal to the first and second differential inputs of the differential input buffer circuit with propagation delays minimised, the voltage level shifting circuit comprising:
a first input terminal for receiving a first signal of a differential signal pair of the differential signal;
a second input terminal for receiving a second signal of the differential signal pair of the differential signal;
a first resistive voltage divider circuit coupled between the first input terminal and a voltage reference terminal for receiving the voltage reference;
a second resistive voltage divider circuit coupled between the second input terminal and the voltage reference terminal;
first and second output taps formed, respectively, by the first and second resistive voltage divider circuits, on which taps are produced respective first and second level shifted signals of a level shifted differential signal pair of the level shifted differential signal with the common mode voltage thereof referenced to the voltage reference, the first and second output taps being coupled to the respective first and second differential inputs of the differential input buffer circuit for applying the level shifted differential signal to the differential input buffer circuit;
a first high-frequency-low-impedance circuit forming a direct-current-blocked, high-frequency-low-impedance pathway forming at least part of a path between the first input terminal and the first output tap for accommodating the first signal of the differential signal pair from the first input terminal to the first differential input of the differential input buffer circuit with propagation delays minimised, the first high-frequency-low-impedance circuit and the first resistive voltage divider circuit co-operating with the first intrinsic input capacitance of the first differential input of the differential input buffer circuit to form a first low pass filter;
wherein the impedance of the first high-frequency-low-impedance circuit is selected so that attenuation resulting from the first low pass filter at frequencies corresponding to a data rate of the differential signal is reduced by at least 1 dB relative to a nominal attenuation level applied to signals at frequencies substantially below the data rate;
a second high-frequency-low-impedance circuit forming a direct-current-blocked, high-frequency-low-impedance pathway forming at least part of a path between the second input terminal and the second output tap for accommodating the second signal of the differential signal pair from the second input terminal to the second differential input of the differential input buffer circuit with propagation delays minimised, the second highfrequency-low-impedance circuit and the second resistive voltage divider circuit co-operating with the second intrinsic input capacitance of the second differential input of the differential input buffer circuit to form a second low pass filter; and the first and second low pass filters acting to filter out noise in the differential signal at frequencies above the cut-off frequencies of the first and second low pass filters.

23. A differential input stage circuit as claimed in claim 22 in which the first high-frequency-low-impedance circuit is coupled in parallel with at least a portion of the first resistive voltage divider circuit extending between the first input terminal and the first output tap.

24. A differential input stage circuit as claimed in claim 22 in which the first high-frequency-low-impedance circuit is coupled in parallel with the first resistive voltage divider circuit extending between the first input terminal and the first output tap.

25. A differential input stage circuit as claimed in claim 22 in which the first high-frequency-low-impedance circuit comprises a first capacitive element.

26. A differential input stage circuit as claimed in claim 25 in which the first high-frequency-low-impedance circuit comprises a first resistive element coupled in series with the first capacitive element.

27. A differential input stage circuit as claimed in claim 26 in which the first resistive element is provided by a portion of the first resistive voltage divider circuit extending between the first input terminal and the first output tap.

28. A differential input stage circuit as claimed in claim 26 in which the first resistive element is coupled between the first input terminal and the first capacitive element.

29. A differential input stage circuit as claimed in claim 26 in which values of the first resistive element and the first capacitive element are selected so that the impedance offered by the first high-frequency-low-impedance circuit to signals of frequency corresponding to the data rate of the differential signal is less than an impedance offered to signals of such frequency by a portion of the first resistive voltage divider circuit between the first input terminal and the first output tap.

30. A differential input stage circuit as claimed in claim 22 in which the impedance of the first high-frequency-low-impedance circuit is selected so that the attenuation resulting from the first low pass filter at frequencies corresponding to the data rate of the differential signal is reduced by at least 3 dB relative to a nominal attenuation level applied to signals at frequencies substantially below the data rate.

31. A differential input stage circuit as claimed in claim 25 in which a value of the first capacitive element is selected to be greater than a value produced by a product of a value of the first intrinsic input capacitance of the differential input buffer circuit by a division ratio of the first resistive voltage divider circuit.

32. A differential input stage circuit as claimed in claim 22 in which the second high-frequency-low-impedance circuit is coupled in parallel with at least a portion of the second resistive voltage divider circuit extending between the second input terminal and the second output tap.

33. A differential input stage circuit as claimed in claim 22 in which the second high-frequency-low-impedance circuit is coupled in parallel with the second resistive voltage divider circuit extending between the second input terminal and the second output tap.

34. A differential input stage circuit as claimed in claim 22 in which the second high-frequency-low-impedance circuit comprises a second capacitive element.

35. A differential input stage circuit as claimed in claim 34 in which the second high-frequency-low-impedance circuit comprises a second resistive element coupled in series with the second capacitive element.

36. A differential input stage circuit as claimed in claim 35 in which the second resistive element is provided by a portion of the second resistive voltage divider circuit extending between the second input terminal and the second output tap.

37. A differential input stage circuit as claimed in claim 35 in which the second resistive element is coupled between the second input terminal and the second capacitive element.

38. A differential input stage circuit as claimed in claim 35 in which values of the second resistive element and the second capacitive element are selected so that the impedance offered by the second high-frequency-low-impedance circuit to signals of frequency corresponding to the data rate of the differential signal is less than an impedance offered to signals of such frequency by a portion of the second resistive voltage divider circuit between the second input terminal and the second output tap.

39. A differential input stage circuit as claimed in claim 22 in which the impedance of the second high-frequency-low-impedance circuit is selected so that attenuation resulting from the second low pass filter at frequencies corresponding to the data rate of the differential signal is reduced by at least 1 dB relative to a nominal attenuation level applied to signals at frequencies substantially below the data rate.

40. A differential input stage circuit as claimed in claim 39 in which the impedance of the second high-frequency-low-impedance circuit is selected so that the attenuation resulting from the second low pass filter at frequencies corresponding to the data rate of the differential signal is reduced by at least 3 dB relative to a nominal attenuation level applied to signals at frequencies substantially below the data rate.

41. A differential input stage circuit as claimed in claim 34 in which a value of the second capacitive element is selected to be greater than a value produced by a product of a value of the second intrinsic input capacitance of the differential input buffer circuit by a division ratio of the second resistive voltage divider circuit.

42. A method for producing a level shifted differential signal from a differential signal with a common mode voltage of the level shifted differential signal referenced to a voltage reference and for applying the level shifted differential signal to a differential input buffer circuit with propagation delays minimised, the differential input buffer circuit comprising first and second differential inputs for receiving the level shifted differential signal, the first and second differential inputs of the differential input buffer circuit having respective first and second intrinsic input capacitance, the method comprising:

providing a voltage level shifting circuit comprising:
a first input terminal for receiving a first signal of a differential signal pair of the differential signal;
a second input terminal for receiving a second signal of the differential signal pair of the differential signal;
a first resistive voltage divider circuit coupled between the first input terminal and a voltage reference terminal;
a second resistive voltage divider circuit coupled between the second input terminal and the voltage reference terminal;
first and second output taps formed, respectively, by the first and second resistive voltage divider circuits, on which taps are produced respective first and second level shifted signals of a level shifted differential signal pair of the level shifted differential signal with the common mode voltage thereof referenced to the voltage reference for applying to the first and second differential inputs, respectively, of the differential input buffer circuit;

the method further comprising:

providing a first high-frequency-low-impedance circuit forming a direct-current-blocked, high-frequency-low-impedance pathway forming at least part of a path between the first input terminal and the first output tap for accommodating the first signal of the differential signal pair from the first input terminal to the first output tap with propagation delays minimised when the first level shifted signal of the level shifted differential signal pair is applied to the first differential input of the differential input buffer circuit, the first high frequency low impedance circuit and the first resistive voltage divider circuit co-operating with the first intrinsic input capacitance of the first differential input of the differential input buffer circuit to form a first low pass filter;

wherein the impedance of the first high-frequency-low-impedance circuit is selected so that attenuation resulting from the first low pass filter at frequencies corresponding to a data rate of the differential signal is reduced by at least 1 dB relative to a nominal attenuation level applied to signals at frequencies substantially below the data rate;

providing a second high-frequency-low-impedance circuit forming a direct-current-blocked, high-frequency-low-impedance pathway forming at least part of a path between the second input terminal and the second output tap for accommodating the second signal of the differential signal pair from the second input terminal to the second output tap for minimising propagation delays when the second level shifted signal of the level shifted differential signal pair is applied to the second differential input of the differential input buffer circuit, the second high frequency low impedance circuit and the second resistive voltage divider circuit co-operating with the second intrinsic input capacitance of the second differential input of the differential input buffer circuit to form a second low pass filter, the first and second low pass filters acting to filter out noise in the differential signal at frequencies above the cut-off frequencies of the first and second low pass filters;

applying the voltage reference to the voltage reference terminal;

applying first and second signals of the differential signal pair of the differential signal to the respective first and second input terminals; and applying the level shifted first and second signals of the level shifted differential signal pair on the first and second output taps to the respective first and second differential inputs of the differential input buffer circuit.

* * * * *